United States Patent
Lehtola

(10) Patent No.: US 9,621,119 B2
(45) Date of Patent: Apr. 11, 2017

(54) POWER AMPLIFIER BIAS SIGNAL MULTIPLEXING

(71) Applicant: SKYWORKS SOLUTIONS, INC., Woburn, MA (US)

(72) Inventor: Philip John Lehtola, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/018,145

(22) Filed: Feb. 8, 2016

(65) Prior Publication Data

US 2016/0248379 A1    Aug. 25, 2016

Related U.S. Application Data

(60) Provisional application No. 62/116,032, filed on Feb. 13, 2015.

(51) Int. Cl.
| | |
|---|---|
| *H03F 3/06* | (2006.01) |
| *H03F 3/21* | (2006.01) |
| *H03F 3/19* | (2006.01) |
| *H03F 1/02* | (2006.01) |
| *H03F 3/24* | (2006.01) |
| *H03F 3/72* | (2006.01) |

(52) U.S. Cl.
CPC ........... *H03F 3/211* (2013.01); *H03F 1/0261* (2013.01); *H03F 3/19* (2013.01); *H03F 3/245* (2013.01); *H03F 3/72* (2013.01); *H03F 2200/111* (2013.01); *H03F 2200/451* (2013.01); *H03F 2200/555* (2013.01); *H03F 2203/21109* (2013.01); *H03F 2203/7209* (2013.01)

(58) Field of Classification Search
CPC ........................................................ H03F 3/04
USPC ......................................... 330/296, 136, 127
See application file for complete search history.

(56) References Cited

U.S. PATENT DOCUMENTS

| | | | |
|---|---|---|---|
| 6,396,298 B1* | 5/2002 | Young | G01R 31/2621 324/762.09 |
| 2005/0110576 A1* | 5/2005 | Rhodes | H03F 3/217 330/305 |
| 2008/0252792 A1* | 10/2008 | Misawa | H03F 3/72 348/730 |
| 2009/0066439 A1* | 3/2009 | Whelan | H03F 1/565 333/32 |
| 2015/0061777 A1* | 3/2015 | de Rooij | H03F 3/195 330/296 |
| 2015/0145603 A1* | 5/2015 | Bushmaker | H03F 1/0272 330/296 |
| 2015/0349397 A1* | 12/2015 | Barbieri | H03F 3/193 330/296 |

* cited by examiner

*Primary Examiner* — Patricia T Nguyen
(74) *Attorney, Agent, or Firm* — Chang & Hale LLP

(57) ABSTRACT

A power amplifier (PA) system includes an amplifying transistor having a base, a collector, and an emitter. The PA system further includes a radio-frequency (RF) input configured to receive an RF input signal having an RF component and a DC bias component, a bias circuit coupled to the base of the amplifying transistor, and a bias tee circuit configured to receive the RF input signal and pass at least a portion of the DC component to the bias circuit and at least a portion of the RF component to the base of the amplifying transistor.

20 Claims, 10 Drawing Sheets

POWER AMPLIFIER BIAS SIGNAL MULTIPLEXING

RELATED APPLICATIONS

This application claims priority to U.S. Provisional Application No. 62/116,032, filed Feb. 13, 2015, and entitled POWER AMPLIFIER BIAS SIGNAL MULTIPLEXING, the disclosure of which is hereby incorporated by reference in its entirety.

BACKGROUND

Field

The present disclosure generally relates to the field of electronics, and more particularly, to radio-frequency (RF) modules and devices.

Description of Related Art

RF modules and dies, including power amplifiers, may have various inputs and outputs associated therewith. Multiple input/output lines can result in undesirable routing complexity.

SUMMARY

In some implementations, the present disclosure relates to a power amplifier (PA) system comprising an amplifying transistor having a base, a collector, and an emitter, a radio-frequency (RF) input configured to receive an RF input signal having an RF component and a DC bias component, a bias circuit coupled to the base of the amplifying transistor, and a bias tee circuit configured to receive the RF input signal and pass at least a portion of the DC component to the bias circuit and at least a portion of the RF component to the base of the amplifying transistor. The bias tee circuit may operate to at least partially decouple the RF component from the DC bias component. In certain embodiments, the bias tee includes an inductor and a resistor.

The PA system may further comprise a voltage supply input configured to receive a supply voltage for amplifying an output of the amplifying transistor. In certain embodiments, the DC bias component of the RF input signal includes a bias current. Alternatively, the DC bias component of the RF input signal may include a bias voltage. The bias circuit may include current mirror circuitry.

In some implementations, the present disclosure relates to a method for biasing a power amplifier (PA). The method may involve providing a radio-frequency (RF) input signal to a power amplifier module, the RF input signal having an RF component and a DC bias component, decoupling the DC bias component of the RF input signal from the RF component, providing the decoupled DC bias component to a bias circuit coupled to a base of an amplifying transistor of the power amplifier module, providing the decoupled RF component to the base of the amplifying transistor, and generating an RF output signal using the amplifying transistor. Decoupling the DC bias component from the RF component may be performed using a bias tee including an inductor and a resistor.

The method may further involve providing a supply voltage to the amplifying transistor. In certain embodiments, the DC bias component of the RF input signal includes a bias current. In certain embodiments, the DC bias component of the RF input signal includes a bias voltage. In certain embodiments, the bias circuit includes current mirror circuitry.

In some implementations, the present disclosure relates to a radio-frequency (RF) module comprising a packaging substrate configured to receive a plurality of components, a power amplifier (PA) die mounted on the packaging substrate, the PA die including a first semiconductor substrate having formed thereon an amplifying transistor having a base, a collector, and an emitter, a radio-frequency (RF) input to the PA die configured to receive an RF input signal having an RF component and a DC bias component, a bias circuit implemented on the first semiconductor substrate, the bias circuit coupled to the base of the amplifying transistor, a first bias tee circuit implemented on the first semiconductor substrate, the first bias tee circuit configured to receive the RF input signal and at least partially pass the DC bias component to the bias circuit and the RF component to the base of the amplifying transistor, and a plurality of connectors configured to provide electrical connections between the PA die and the packaging substrate.

The RF module may further comprise a controller die mounted on the packaging substrate, the controller die including a second semiconductor substrate and a bias signal generator configured to transmit a bias signal on a bias channel of the RF module, and an RF transmission channel configured to transmit an RF signal within the RF module. In certain embodiments, the RF module further comprises a second bias tee circuit coupled to the bias channel and the RF transmission channel, the second bias tee circuit configured to couple the bias signal with the RF signal to form the RF input signal at least in part. The bias signal generator may be a current generator or a voltage generator. The controller die may include an input switching module implemented on the second semiconductor substrate. In certain embodiments, the first semiconductor substrate is a GaAs substrate and the second semiconductor substrate is a silicon-on-insulator (SOI) die. In certain embodiments, the PA die does not receive the bias signal separately from the RF input signal.

In some implementations, the present disclosure relates to a power amplifier (PA) die comprising a semiconductor substrate, and an amplifying transistor implemented on the semiconductor substrate, the amplifying transistor having a base, a collector, and an emitter. The PA die may further comprise a radio-frequency (RF) input configured to receive an RF input signal having an RF component and a DC bias component, a bias circuit implemented on the semiconductor substrate, the bias circuit coupled to the base of the amplifying transistor, and a bias tee circuit implemented on the semiconductor substrate, the bias tee circuit configured to receive the RF input signal and at pass at least a portion of the DC component to the bias circuit and at least a portion of the RF component to the base of the amplifying transistor.

In some implementations, the present disclosure relates to a power amplifier module comprising a packaging substrate configured to receive a plurality of components and an amplifying transistor formed on a die that is mounted on the packaging substrate, the amplifying transistor having a base, a collector, and an emitter. The power amplifier module may further comprise a radio-frequency (RF) input configured to receive an RF input signal having an RF component and a DC bias component, a bias circuit coupled to the base of the amplifying transistor, and/or a bias tee circuit formed on the die, the bias tee circuit configured to receive the RF input signal and at pass at least a portion of the DC component to the bias circuit and at least a portion of the RF component to the base of the amplifying transistor.

In some implementations, the present disclosure relates to a wireless device comprising a transceiver configured to process RF signals, an antenna in communication with the transceiver configured to facilitate transmission of an amplified RF signal, and a power amplifier (PA) module including an amplifying transistor having a base, a collector, and an emitter, the PA connected to the transceiver and configured to generate an amplified RF signal. The wireless device may further comprise a radio-frequency (RF) input to the PA module, the RF input configured to receive an RF input signal having an RF component and a DC bias component, a bias circuit coupled to the base of the amplifying transistor, a bias tee circuit configured to receive the RF input signal and pass at least a portion of the DC component to the bias circuit and at least a portion of the RF component to the base of the amplifying transistor, and a switch connected to the antenna and the power amplifier and configured to selectively route the amplified RF signal to the antenna.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

DETAILED DESCRIPTION

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

Figure 1:
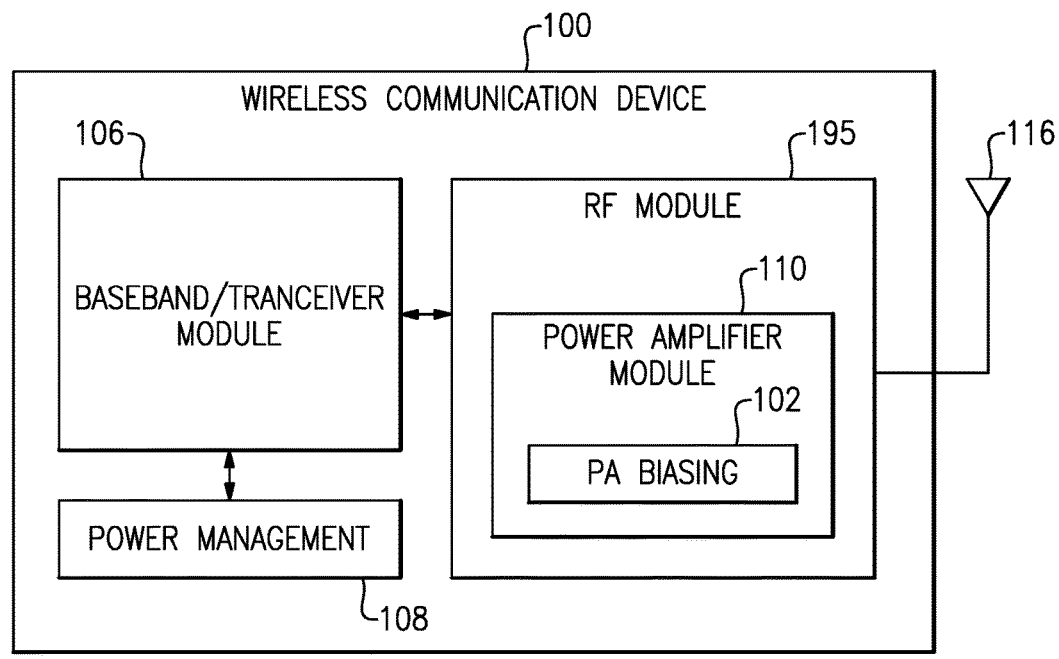
FIG. 1 is a block diagram illustrating an embodiment of a wireless communication device.

FIG. 1 is a block diagram illustrating an embodiment of a wireless communication device 100. Although described with particular reference to a wireless communication devices, such as a mobile telephones or other mobile computing devices, systems and methods for multiplexing bias signals in power amplifier systems as described herein may advantageously be applicable in any device or system including a power amplifier, or other device for which simplified routing of transmission lines may be desirable. Bias signal multiplexing as described herein may be implemented as part of an integrated module that additionally and/or alternatively contains circuit elements other than those shown, or can be implemented as a discrete power amplifier/control module.

Systems and methods for bias signal multiplexing as described herein may be implemented at least partially in hardware. Such hardware implementations may include one or more discrete electronic components, integrated electronic components, discrete logic circuits having logic gates for implementing logic functions upon data signals, application specific integrated circuits (ASIC) having appropriate logic gates, field-programmable gate arrays (FPGA), and/or the like.

Embodiments of systems and/or methods of bias signal multiplexing can be implemented in any device having an RF power amplifier, such as the wireless communication device 100. The wireless communication device 100 illustrated in FIG. 1 may be a simplified example of a mobile phone, for example. For simplicity, certain operational/implementation details of the wireless communication device 100 are omitted from the diagram and/or the accompanying text. The wireless communication device 100 may include a baseband and/or transceiver module 106 and a radio-frequency (RF) module (e.g., a front end module) 195, including a power amplifier module 110 having certain power amplifier biasing circuitry 102 associated therewith. The baseband/transceiver module 106 may include modulation and/or up-conversion circuitry for preparing a baseband data signal for amplification and transmission, and may further include filtering and/or down-conversion circuitry for receiving and down-converting an RF signal to a baseband data signal to recover data. While illustrated as a single module, the module 106 may be physically and/or logically separated into one or more separate baseband and/or transceiver blocks, chips, modules, etc.

The baseband/transceiver module 106 may include one or more of the following: a processor, such as a general purpose or special purpose microprocessor; a memory; application software; analog circuit elements; digital circuit elements; input/output (I/O) elements; and/or power amplifier software; coupled, for example, over a system bus. The system bus may include physical and/or logical connections to couple the above-described elements together and enable their interoperability.

The power amplifier module 110 may receive one or more electronic signal inputs, such as an RF input signal, which may be amplified at least in part by an amplifying transistor. In certain embodiments, the number of transmission lines leading to, or associated with, the power amplifier module 110 can cause design and/or performance issues; the routing of transmission lines to the power amplifier module 110, such as lines for transmitting RF signals as well as bias signals to the power amplifier module 110, can require complex routing, which may present various issues, such as cost, size/area, design time/effort, and/or other types of issues. Therefore, it may be desirable to implement various signal routing solutions that reduce or minimize the number of transmission lines that are routed to the power amplifier module.

In certain embodiments, the wireless communication device 100 includes a power management module 108 configured to provide power to the amplifier module. The power management module 108 may include a local power source, such as a battery, or other rechargeable power source, or may include an adaptor that converts AC power to the correct voltage used by components of the wireless communication device 100. In some embodiments, the power management module 108 may be coupled to an external power source, such as, for example, an alternating current (AC) power adaptor or charger, a direct current (DC) adaptor or charger, or another external power source. In certain embodiments, the power source may be used, directly or indirectly, to provide a DC voltage source to the power amplifier module 110, or to one or more amplifying transistors thereof, for the purpose of amplifying an RF signal propagating and/or generated within the power amplifier module 110. The power amplifier module 110 may include a port for receiving such power supply.

In an embodiment, the RF module 195 includes one or more transmit/receive (TX/RX) switches (not shown), such as one or more duplexers, diplexers, or any other physical or logical devices or circuitry configured to separate transmit and receive signals. In certain embodiments, the output of the power amplifier module 110 is provided over a connection to such switch(es), and further to an antenna 116.

In some implementations, the power amplifier module 110 shown in FIG. 1 includes multiple amplification stages. Furthermore, the power amplifier module 110 may integrate matching circuitry, out of band rejection filters, power detectors, and/or bias controls. The RF module 195 may include a power amplifier controller for setting, modifying, or adjusting the amount of power amplification provided by the power amplifier module 110, and/or performing other functionality. The power amplifier module 110 may be a single integrated component that includes the functionality of a power amplifier controller and one or more power amplifiers. In other implementations, the wireless device 100 may include separate power amplifier control circuitry and power amplifier module(s).

Figure 2:
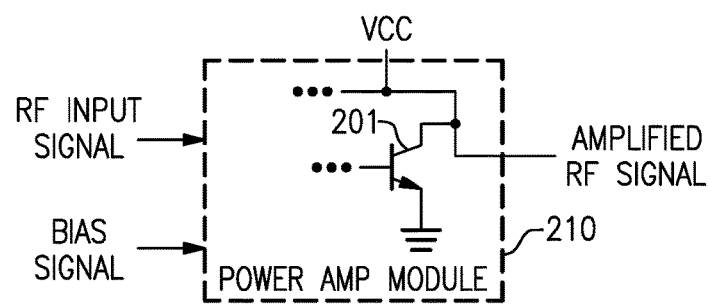
FIG. 2 provides a diagram of a power amplifier module that may be used in an RF module such as that shown in FIG. 1.

FIG. 2 provides a diagram of a power amplifier module 210 that may be used in an RF module such as that shown in FIG. 1. The power amplifier module 210 may receive an RF input signal and provide the RF signal to one or more transistors 201 (e.g., one or more transistor stages). In certain embodiments, the power amplifier module 210 include one or more amplifying transistors 201, which may be, for example, bipolar junction transistor(s) (BJT), wherein the base of the transistor(s) receives the RF signal to be amplified. Each of the one or more transistors 201 may be grounded at its emitter and the voltage level provided at the base of the transistor may control current passing between a collector portion and the emitter portion. The collector may provide an output signal which corresponds to an amplified version of the RF input signal provided to the power amplifier module 210. Various other configurations of power amplifiers may be used in accordance with embodiments disclosed herein and may include power amplifiers comprising any suitable type or configuration of transistor or transistors. The amplifying transistor 201 may be one amplifier of a multi-stage power amplifier. The power amplifier module 210 may be based on SiGe BiCMOS technology, which may use, or leverage, a low impedance path to ground with one or more through silicon vias.

The transistor 201 may be an NPN transistor or a PNP transistor. Although certain embodiments of transistors and substrates are described herein in the context of NPN devices, or devices of other impurity-types, it should be understood that any of the embodiments disclosed herein may comprise collector regions, wells, and/or bulk substrates having any suitable or desirable type or level of doping, such as heavy or light n-type or p-type doping.

Figure 3:
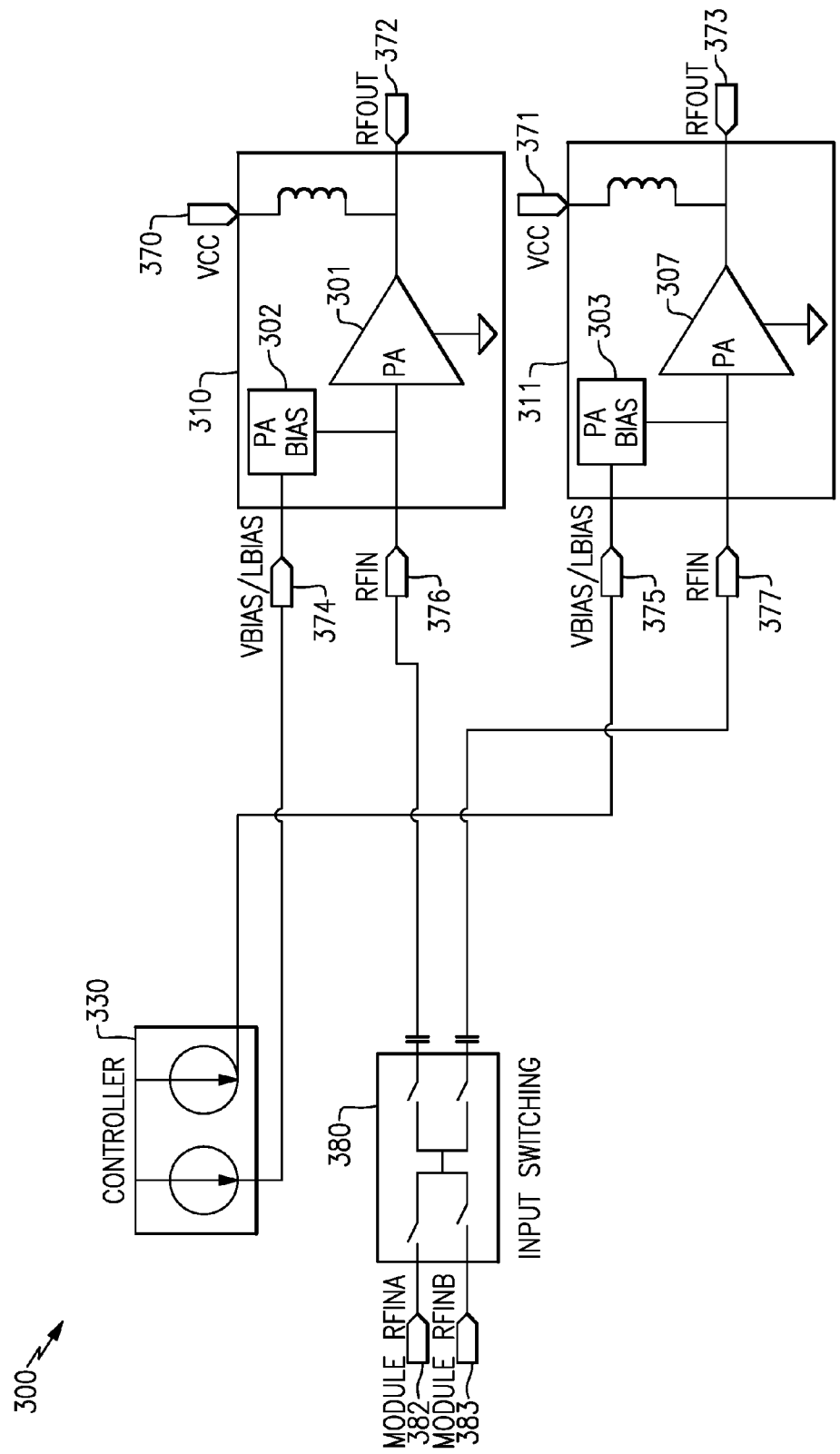
FIG. 3 is a schematic diagram of a power amplifier system according to one or more embodiments.

FIG. 3 is a schematic diagram of a power amplifier system according to one or more embodiments. The power amplifier system 300 may be a system comprising one or more power amplifier modules 310, 311 configured and/or designed to each receive one or more RF input signals 376, 377 as well as one or more voltage and/or current bias signals 374, 375. The RF input signal(s) and bias signal(s) may be routed individually on separate transmission channels, as shown. Depending possibly on the number of power amplifier modules present in the system 300, the complexity of routing of RF and bias signals may present design, cost, and/or other types of issues or complexities.

The various RF input and bias signals may be received by the power amplifier module 310 over a plurality of input ports. For example, the power amplifier module 310 may have separate input/output ports corresponding to one or more of: RF input, RF output, Vcc power supply, voltage bias, and current bias. The Vcc power supply 370 may provide the power supply applied to the amplifying transistor's collector. The RF input to the power amplifier module 310 may be routed through an input switch 380.

The bias signal 374 may provide bias voltage or current designed to facilitate a quiescent state of the amplifier 301. The bias signal 374 may be generated on a CMOS controller die 330 in certain embodiments and routed to the power amplifier module 310. In certain embodiments, the bias signal 374 is a bias current. In another embodiment, the bias signal 374 is a bias voltage.

With integration of multiple amplifiers in a single package, the number of RF inputs, RF outputs, and bias lines can create difficulty with respect to routing. For example, certain systems provide for separate routes for RF input lines between the input switch 380 and the power amplifier module 310 and bias channels (e.g., Vbias/Ibias) between the controller 330 and the power amplifier module 310. Although only two power amplifier modules 310, 311 are shown, the routing problems may be demonstrated by considering an example system comprising a module with, for example, ten power amplifier modules, which may require as many as ten RF input routes, ten RF output routes, 10 voltage supply (Vcc) routes, as well as ten bias (Vbias/Ibias) routes in the module/system in total.

In certain embodiments, the controller 330 is a separate chip from the other illustrated components. Alternatively, the controller 330 may be part of an integrated chip comprising the input switch 380 as well. With respect to an embodiment in which the controller 330 implements current biasing, the controller 330 may comprise one or more DC current generators configured to drive a current mirror on the power amplifier module 310; use of current biasing, as opposed to voltage biasing, may provide relatively better immunity to noise and/or corruption that may occur from RF signals interfering with the bias channel in certain system configurations.

The power amplifier module 310 may include biasing circuitry 302 configured to bias out the power amplifier 301. The biasing circuitry 302 may comprise a current mirror, wherein a reference transistor is designed to provide a desirable ratio with respect to the size of the amplifying transistor; current from the controller may be dropped across the reference transistor, which, based on the mirror ratio of the reference to the actual transistors in the array, may substantially set up the quiescent current of the amplifying transistor(s) in the power amplifier 301.

Figure 4:
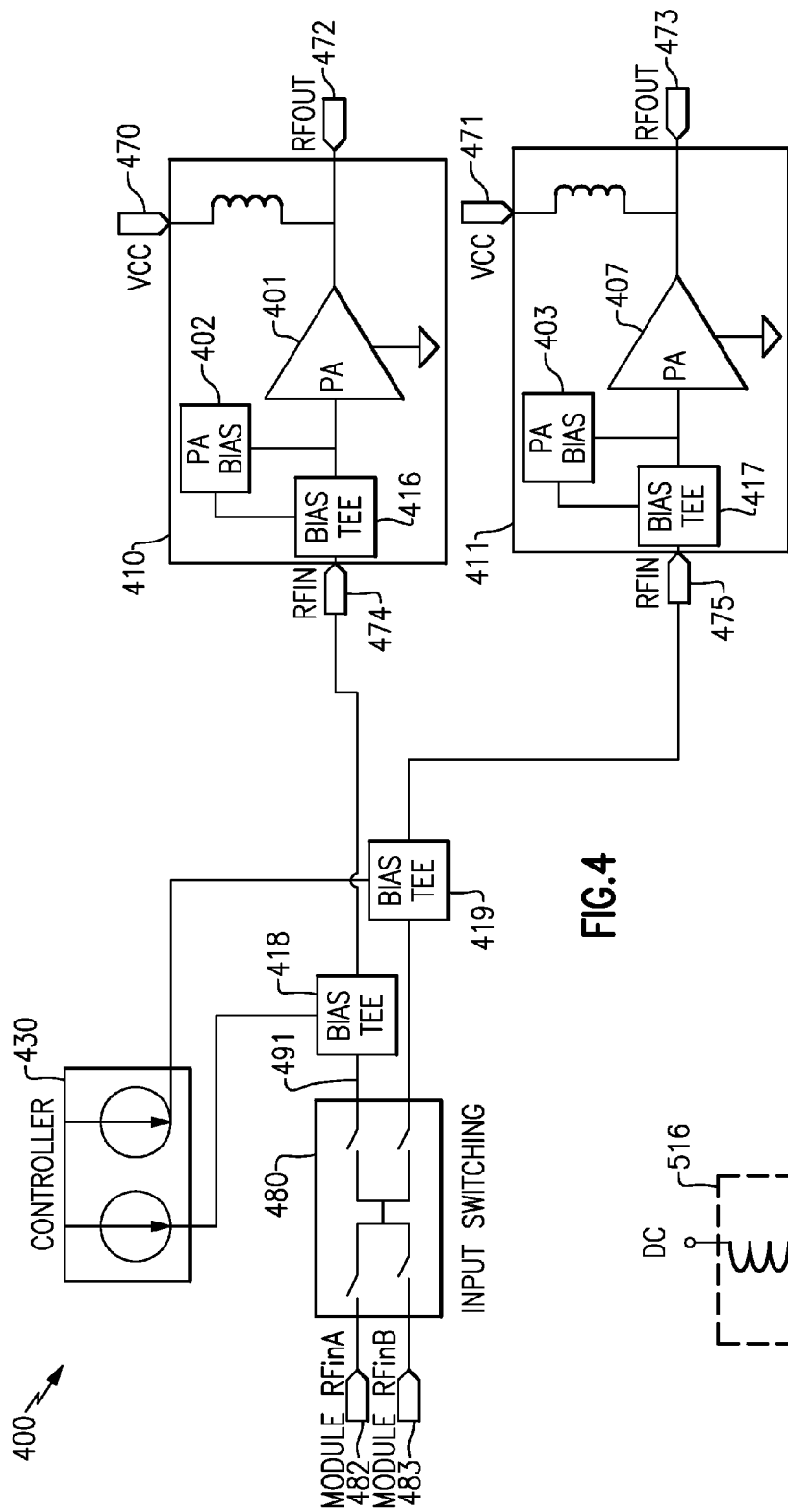
FIG. 4 is a schematic diagram of a power amplifier system configured to implement bias signal multiplexing according to one or more embodiments.

FIG. 4 is a schematic diagram of a power amplifier system 400 configured to implement bias signal multiplexing according to one or more embodiments. Although two power amplifier modules 410, 411 are shown, the principles disclosed herein may be applicable for systems including any number of power amplifier modules. Unlike the system shown in FIG. 3, the system 400 includes one or more bias tee components designed to provide multiplexing of the bias and RF signal lines, thereby providing reduced routing requirements for intra-module transmissions. That is, solutions disclosed herein may allow for reduced numbers of routes in the system/module by coupling the bias signal (Vbias/Ibias) onto the RF input signal.

As shown, one bias tee circuit 418 may be placed at the output of the RF input switch 480 that couples the bias signal from the controller 430 onto the RF input line 491, as well as another bias tee circuit 416 on the power amplifier module 410 that decouples the bias signal and the RF input. Such a configuration may benefit from at least one fewer transmission line that must be routed to the power amplifier module 410. Reduced transmission line routing may allow for reduced amplifier module size.

In systems in which the controller 430 and input switch 480 are disposed on the same die, the routing of bias signals between them may be relatively trivial compared to routing of signals between separate chips. Therefore, certain solutions disclosed herein may be particularly advantageous where the input switch 480 is co-located with the controller 430.

Figure 5:
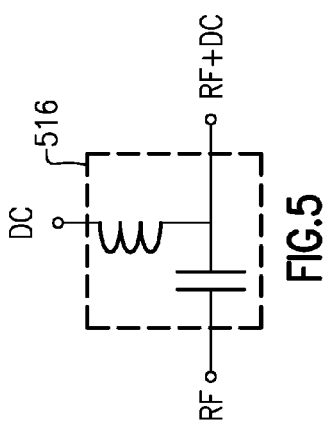
FIG. 5 is a diagram of a bias tee circuit according to one or more embodiments.

The various illustrated bias tee circuits may have any desirable or suitable configuration. FIG. 5 is a diagram of a bias tee circuit according to one or more embodiments. A bias tee circuit may be a three-port network, or diplexer. The bias tee 516 may comprise a low frequency port, which may be used to set the bias, whereas a high frequency port may pass the RF signals while blocking the biasing levels. The third port may see both the bias and RF signals. Although the bias tee 516 shows a single inductor and a single capacitor, other bias tee configurations are contemplated within the scope of the present disclosure.

Figure 6:
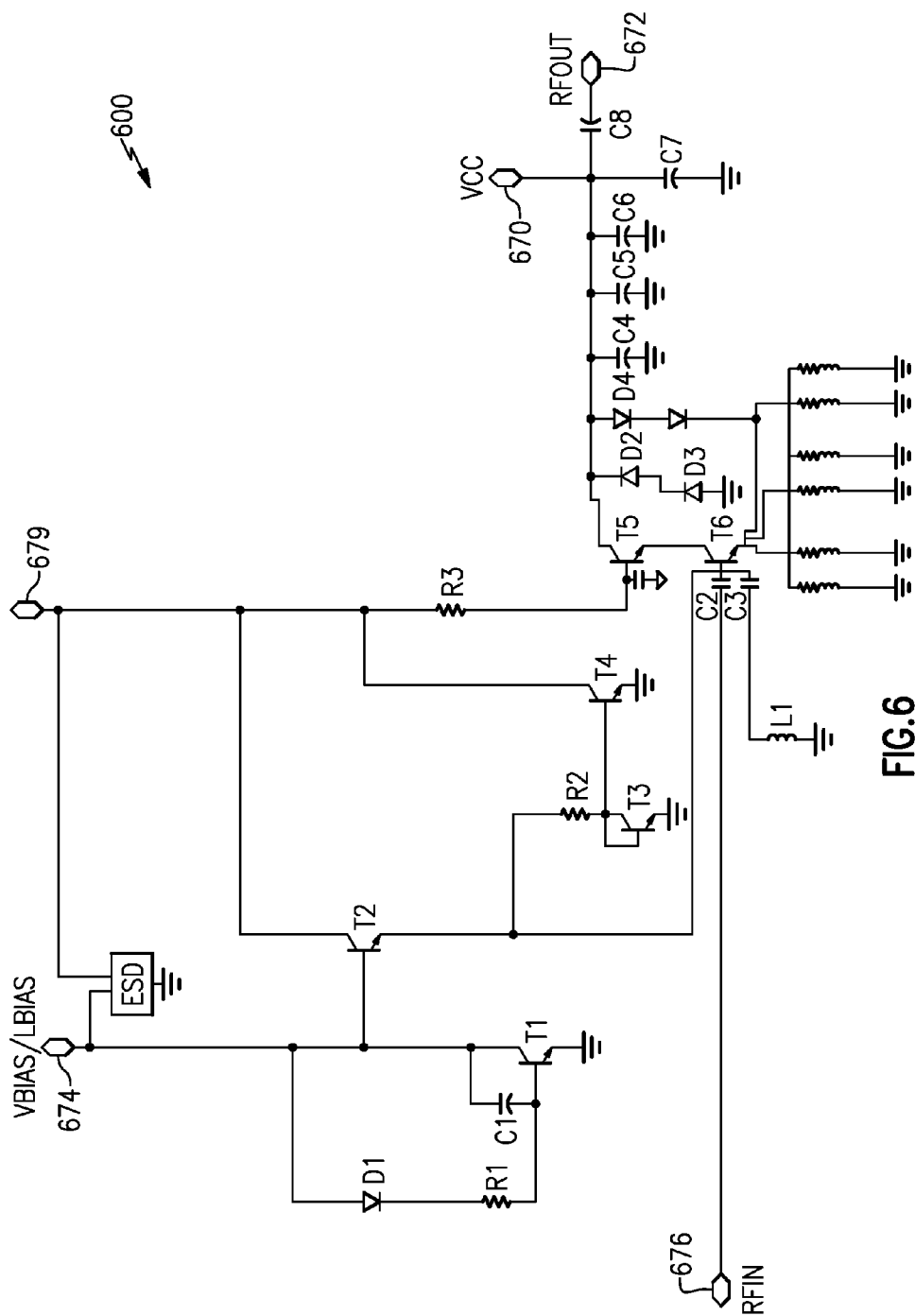
FIG. 6 is a schematic diagram of a power amplifier system according to one or more embodiments.

FIG. 6 is a schematic diagram of a power amplifier system 600 according to one or more embodiments. The system 600 may be a power amplifier module, and may be part of a larger RF system configured to communicate with the power amplifier system 600 over the various illustrated ports 676, 674, 679, 670, 672. The system 600 includes an RF input port 676, bias port 674, power supply (Vcc) port 670 and RF output port 672. Similarly to the system in FIG. 3, the system 600 is configured to receive an RF signal and bias signal over separate ports, which may be routed to by separate transmission lines in a larger system.

Figure 7:
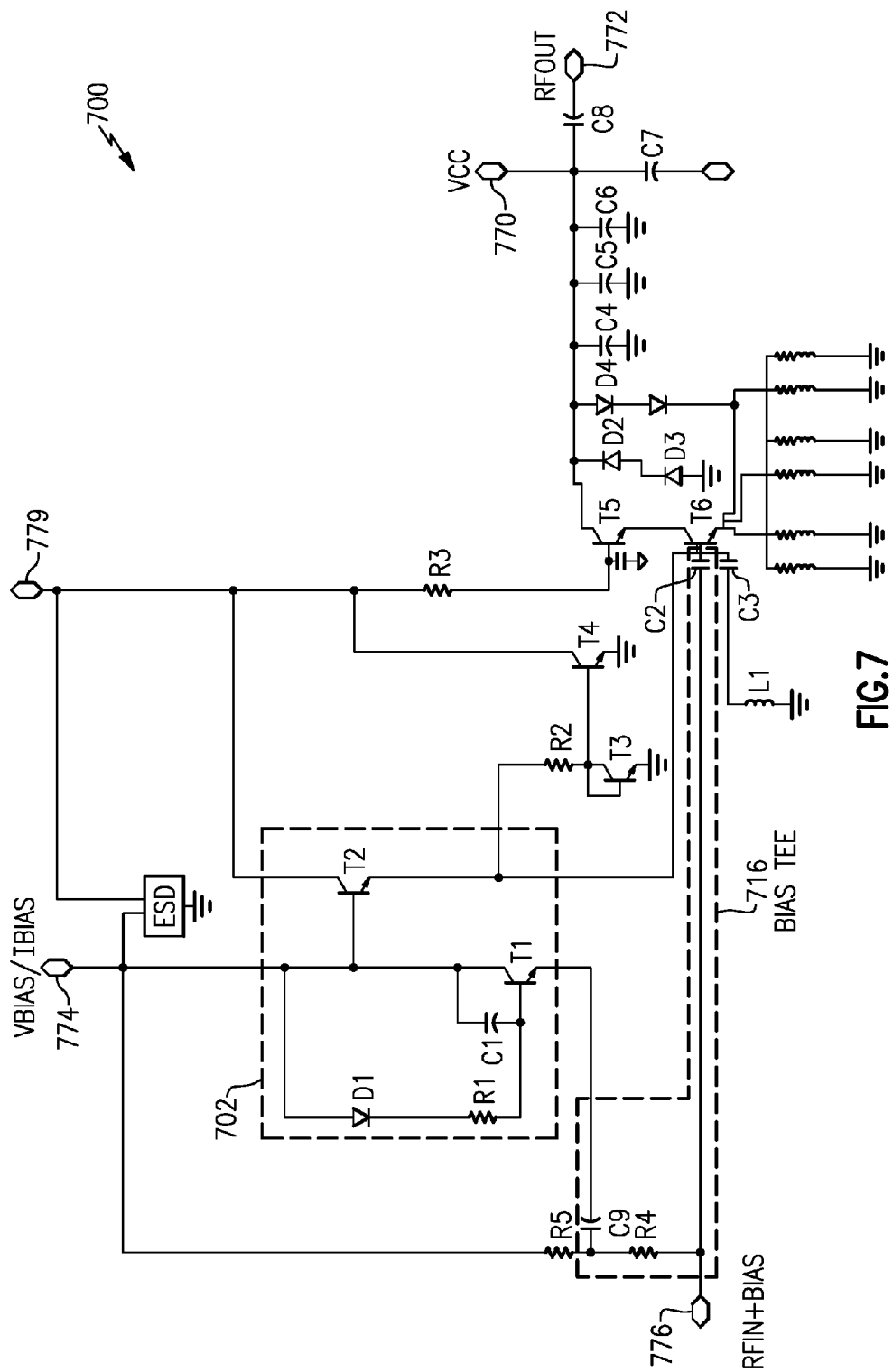
FIG. 7 is a schematic diagram of a power amplifier system configured to implement bias signal multiplexing according to one or more embodiments.

FIG. 7 is a schematic diagram of a power amplifier system 700 configured to implement bias signal multiplexing according to one or more embodiments. The system 700 may be a power amplifier module, and may be part of a larger RF system configured to communicate with the power amplifier system 700 over the various illustrated ports 776, 774, 779, 770, 772. The system 700 includes an RF input port 776, power supply (Vcc) port 770 and RF output port 772. While the system 700 may include the port 774, which in certain systems may be used to receive a bias signal separately from the input port 776, in the illustrated system, the port may not be used for such purpose; that is, similarly to the system in FIG. 4, the system 700 may utilize a single port 776 for inputting the RF signal and the bias signal.

The combined RF and bias signal received at port 776 may be substantially decoupled using a bias tee circuit 716. In particular, the DC may be coupled off through a resistor R4, as shown. The bias tee 716 may further include a relatively small bypass capacitor C9 configured to substantially isolate RF signals from interfering with power amplifier bias circuitry 702. The RF input signal may propagate through the capacitor C2, which serves to substantially isolates the DC signal and allows the RF signal to travel into the base of the amplifying transistor T6. The resistor/capacitor network of the bias tee 716 therefore provides the multiplexing functionality, allowing the device current to flow into the bias reference transistors T1, T2 and allowing the RF input to flow into the input of the amplifying transistor(s) (e.g., transistor T6).

The power amplifier bias circuitry 702 presents a current mirror bias circuit, providing biasing for a cascode amplifier consisting of at least the transistor T5 and the transistor T6. The transistor T6 may represent the common emitter portion of the cascode amplifier, while the transistor T5 represents the common base.

The system 700 may include an additional port 779, which may provide a voltage supply for the bias circuit 702. Because the power amplifier may draw a significant amount of collector current, the collector of the transistor T2 may be tied to the supply 779 in order to supply the required amount of base current; the transistor T2 may represent an emitter follower transistor that provides the current for the amplifying transistor; the transistor T2 may set the bias impedance to the base of the amplifying transistor T6. A bleed current path may extend through the transistor T3 in order to keep the transistor T2 in a substantially low-impedance state. The transistor T4 may mirror current through the transistor T3, pulling current away from the base of the transistor T5 for providing enhanced ruggedness.

In certain embodiments, the base current that goes into the amplifying transistor is provided by the supply 779. Alternatively, rather than the supply 779, the system 700 may comprise a diode connected to the transistor T1 and further connected to the base of the amplifying transistor T6.

The capacitors C4, C5, C6, C7 may serve to provide harmonic termination for the power amplifier, while the capacitor C8 may provide DC blocking between the collector and RF output of the power amplifier. The port 770 may provide the actual voltage supply for the amplified current.

The system 700 may further provide electrostatic discharge (ESD) protection, and may comprise one or more forward and/or reverse diodes tied to ground. For example, the ESD protection circuitry may comprise one or more series diodes from the supply 779 to ground as well as one or more reverse diodes from ground to the supply 779.

Figure 8A:
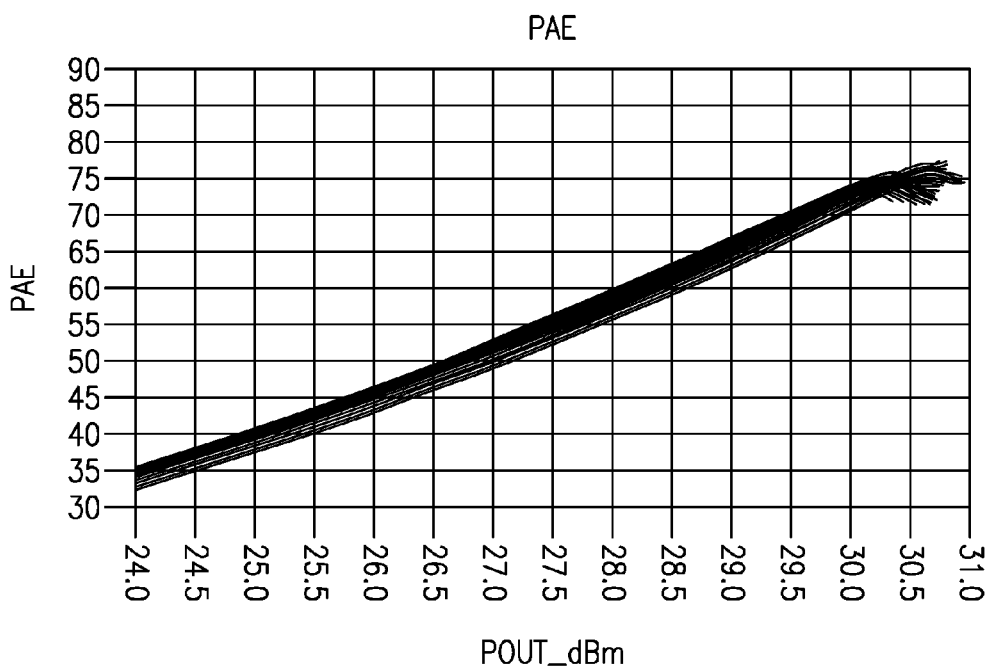
FIGS. 8A and 8B are graphs illustrating possible relationships between efficiency and output power in power amplifier systems according to certain embodiments disclosed herein.
Figure 8B:
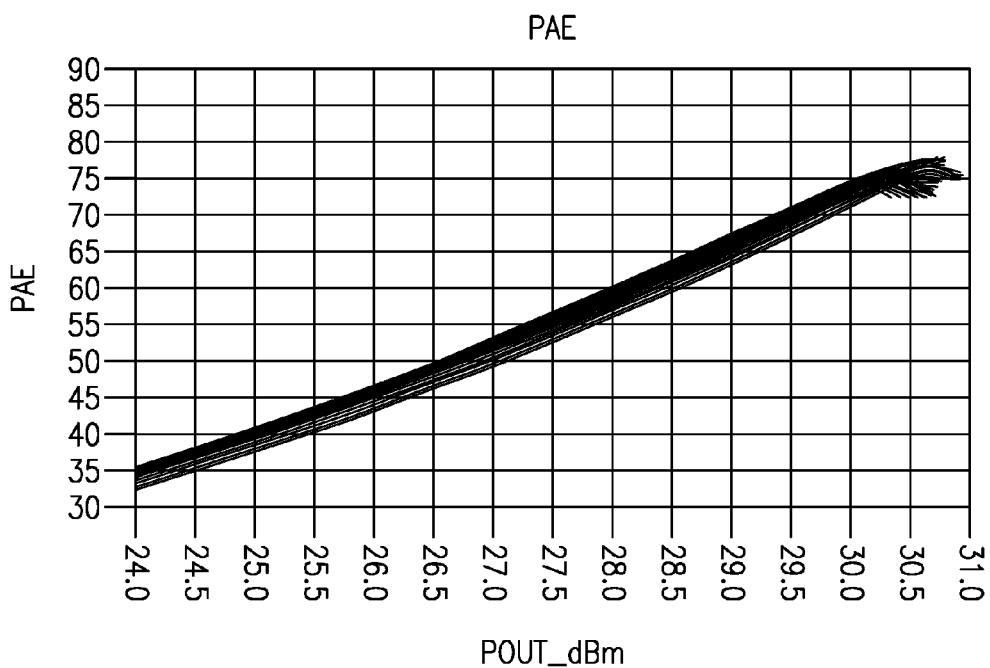

FIGS. 8A and 8B are graphs illustrating possible relationships between efficiency and output power in power amplifier systems according to certain embodiments disclosed herein. Specifically, FIG. 8A may correspond to example performance in a system including separate input lines for bias and RF signals, while FIG. 8B may correspond to example performance in a system including combined RF and bias signal input, with bias tee decoupling, as described herein. As shown, in certain embodiments, use of power amplifier bias multiplexing as described herein may be implemented without substantial degradation relative to alternative systems.

Figure 9A:
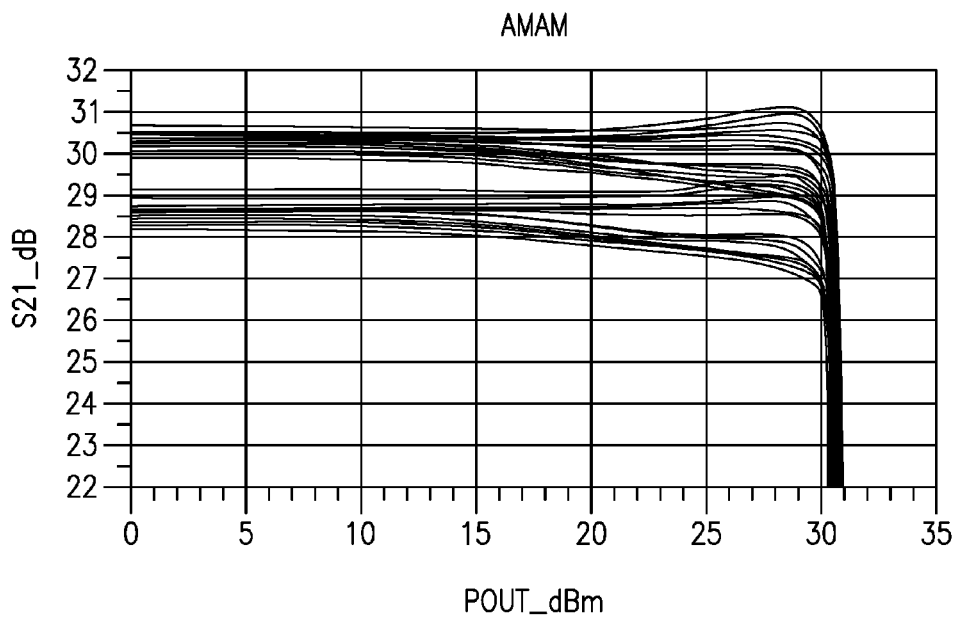
FIGS. 9A and 9B are graphs illustrating possible relationships between gain and output power in power amplifier systems according to certain embodiments disclosed herein.
Figure 9B:
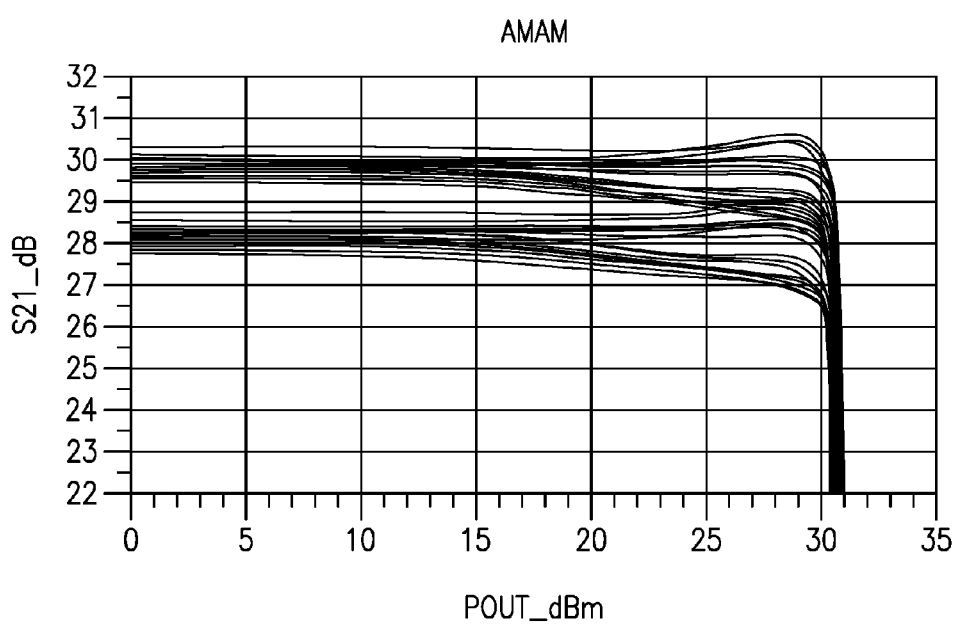

FIGS. 9A and 9B are graphs illustrating possible relationships between gain and output power in power amplifier systems according to certain embodiments disclosed herein. Specifically, FIG. 9A may correspond to example performance in a system including separate input lines for bias and RF signals, while FIG. 9B may correspond to example performance in a system including combined RF and bias signal input, with bias tee decoupling, as described herein. As shown, in certain embodiments, use of power amplifier bias multiplexing as described herein may be implemented without substantial corruption relative to alternative systems across the dynamic range of the power amplifier. Therefore, in certain embodiments, a bias tee circuit may be utilized, wherein adequate DC isolation is achieved.

Figure 10A:
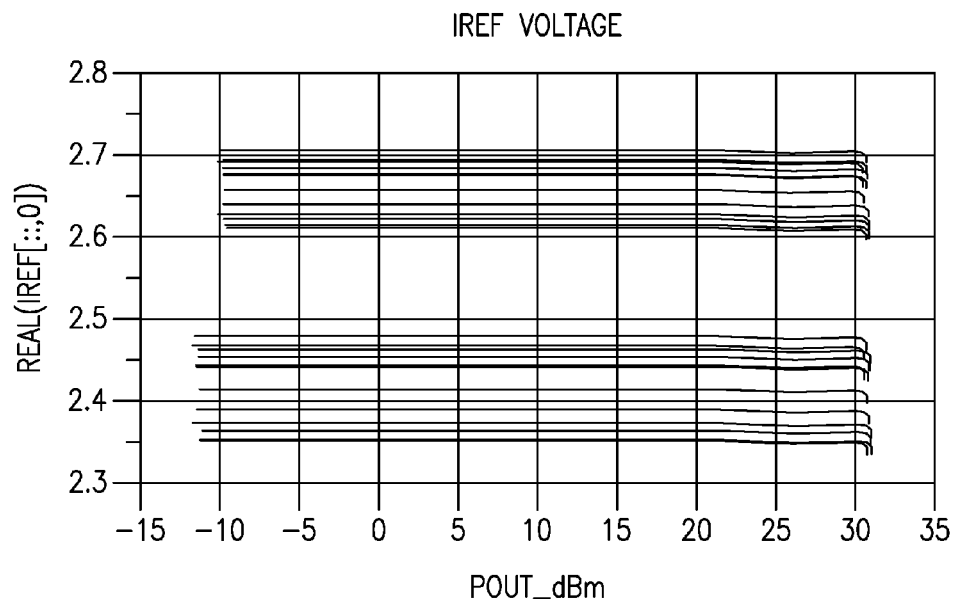
FIGS. 10A and 10B are graphs illustrating possible DC voltage levels present at RF input ports in power amplifier systems according to certain embodiments disclosed herein.
Figure 10B:
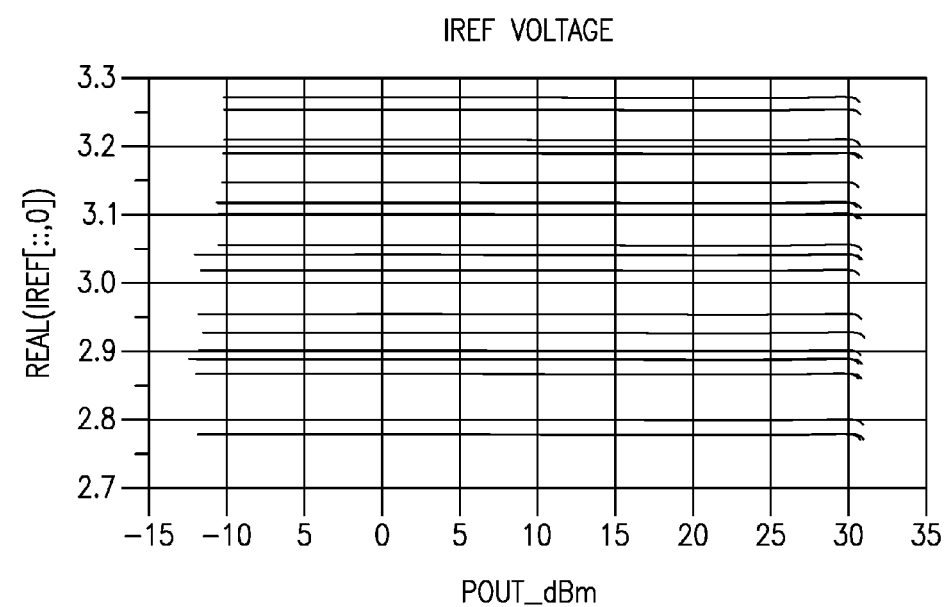

FIGS. 10A and 10B are graphs illustrating possible DC voltage levels present at RF input ports in power amplifier systems according to certain embodiments disclosed herein. Specifically, FIG. 10A may correspond to example performance in a system including separate input lines for bias and RF signals, while FIG. 10B may correspond to example performance in a system including combined RF and bias signal input, with bias tee decoupling, as described herein. As shown, in certain embodiments, current passed on the RF input port through resistor(s) of a bias tee circuit may experience additional voltage drop compared to a system not including a bias tee circuit. Therefore, it may be desirable for the associated bias generator on the control die to be designed so that it can drive the required bias current with the relatively elevated voltage level (e.g., 3.3 volts) on the output of the current source. Alternatively, in certain embodiments, a bias tee may utilize a large inductor to isolate the DC bias from the RF signal without incurring substantially any additional voltage drop. However, such systems may have increased area and/or cost requirements.

Figure 11:
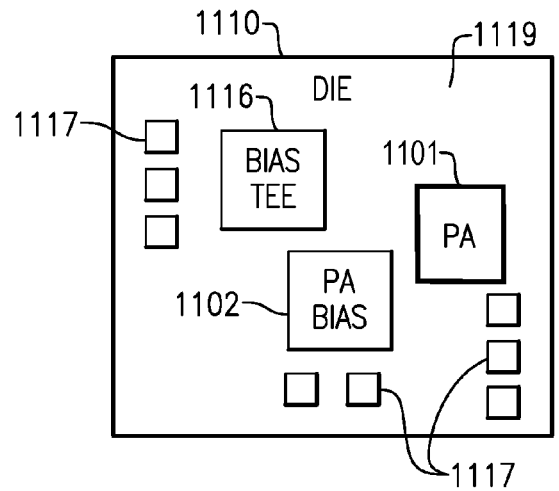
FIG. 11 schematically depicts a die that can include a power amplifier associated with one or more bias circuits and multiplexing bias tee circuits having one or more features as described herein.

FIG. 11 schematically depicts a die 1110 that can include a power amplifier 1101 associated with one or more bias circuits 11101 and multiplexing bias tee circuits 1116 having one or more features as described herein. The semiconductor die 1110 can include a substrate 1119. In some embodiments, the power amplifier (PA) circuit 1101 can also be implemented on the substrate 1119. A plurality of connection pads 1117 can also be formed on the substrate 1119 to provide, for example, power and signals for the PA circuit 1101, the bias circuit 1102 and/or the bias tee circuit 1116.

Figure 12:
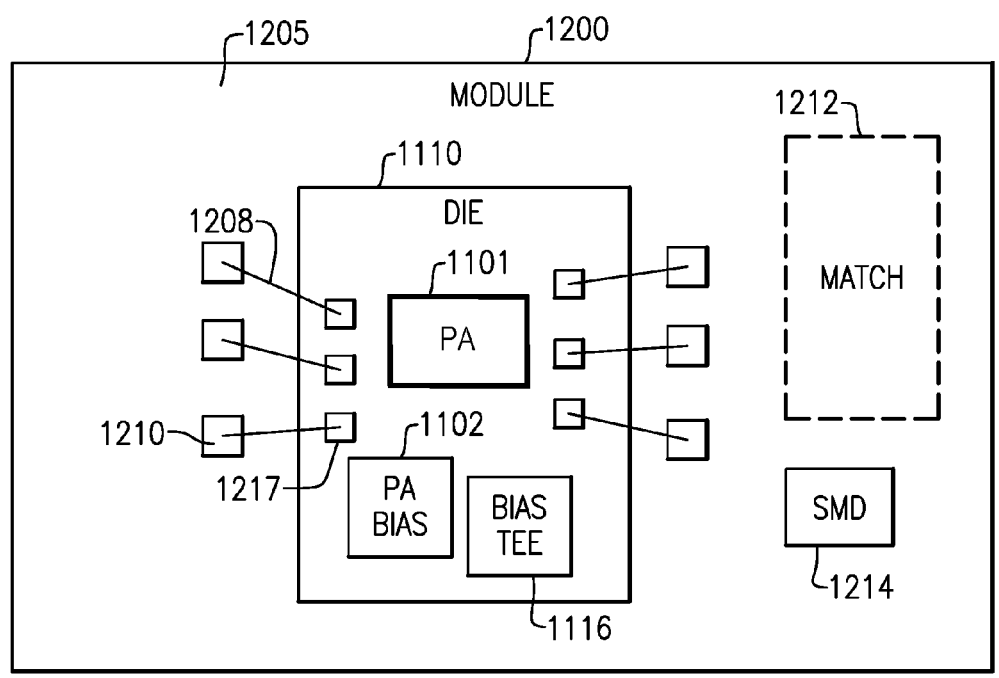
FIG. 12 schematically depicts an example module having a packaging substrate that is configured to receive a plurality of components.

In some implementations, one or more features described herein can be included in a module. FIG. 12 schematically depicts an example module 300 having a packaging substrate 1205 that is configured to receive a plurality of components. In some embodiments, such components can include a die 1110 having one or more featured as described herein. For example, the die 1110 can include a PA circuit 1101, a bias circuit 100, and a bias tee circuit 1116. A plurality of connection pads 1217 can facilitate electrical connections to connection pads 1210 on the substrate 1205 to facilitate passing of various power and signals to and from the die 1110.

In some embodiments, other components can be mounted on or formed on the packaging substrate 1205. For example, one or more surface mount devices (SMDs) (1214) and one or more matching networks (1212) can be implemented. In some embodiments, the packaging substrate 1205 can include a laminate substrate.

In some embodiments, the module 1200 can also include one or more packaging structures to, for example, provide protection and facilitate easier handling of the module 1200. Such a packaging structure can include an overmold formed over the packaging substrate 1205 and dimensioned to substantially encapsulate the various circuits and components thereon.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc.

Figure 13:
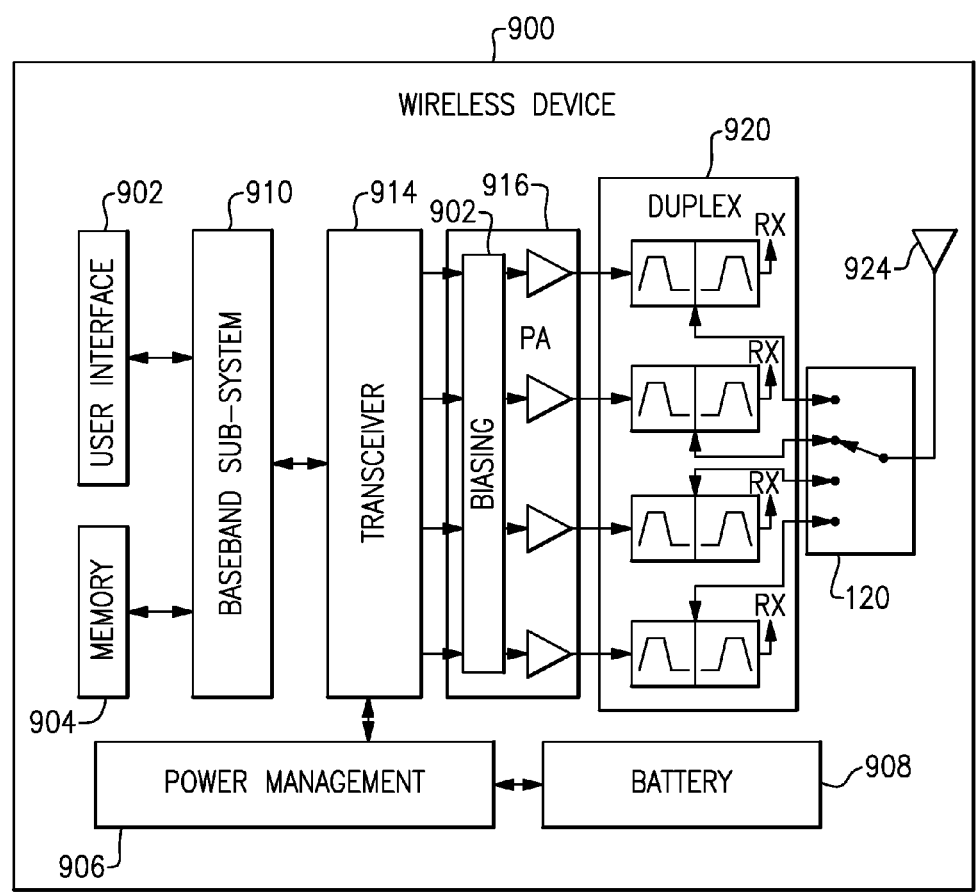
FIG. 13 schematically depicts an example wireless device having one or more advantageous features described herein.

FIG. 13 schematically depicts an example wireless device 900 having one or more advantageous features described herein. In the example wireless device 900, a power amplifier (PA) module 916 having a plurality of PAs can provide an amplified RF signal to a switch 120 (via a duplexer 920), and the switch 120 can route the amplified RF signal to an antenna 924. The PA module 916 can receive an unamplified RF signal from a transceiver 914 that can be configured and operated in a known manner. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 920 can allow transmit and receive operations to be performed simultaneously using a common antenna (e.g., 924). In FIG. 13, received signals are shown to be routed to "Rx" paths (not shown) that can include, for example, low-noise amplifiers (LNAs).

The power amplifier module 916 may comprise certain biasing circuitry 902, which may include one or more bias tees configured to provide coupling and/or decoupling of RF input signals and power amplifier bias signals, as described herein. Therefore, the wireless device 900, and in particular the power amplifier module 916 and/or components or modules having routed connections therewith, may benefit from reduced routing channels and/or channel routing complexity as a result of utilizing RF signal and bias signal multiplexing according to one or more embodiments disclosed herein.

A number of other wireless device configurations can utilize one or more features described herein. For example, a wireless device does not need to be a multi-band device. In another example, a wireless device can include additional antennas such as diversity antennas, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
   an amplifying transistor having a base, a collector, and an emitter;
   a radio-frequency input configured to receive a radio-frequency input signal having a radio-frequency component and a DC bias component;
   a bias circuit coupled to the base of the amplifying transistor; and
   a bias tee circuit configured to receive the radio-frequency input signal and pass at least a portion of the DC component to the bias circuit and at least a portion of the radio-frequency component to the base of the amplifying transistor.

2. The power amplifier system of claim 1 wherein the bias tee circuit operates to at least partially decouple the radio-frequency component from the DC bias component.

3. The power amplifier system of claim 1 wherein the bias tee includes an inductor and a resistor.

4. The power amplifier system of claim 1 further comprising a voltage supply input configured to receive a supply voltage for amplifying an output of the amplifying transistor.

5. The power amplifier system of claim 1 wherein the DC bias component of the radio-frequency input signal includes a bias current.

6. The power amplifier system of claim 1 wherein the DC bias component of the radio-frequency input signal includes a bias voltage.

7. The power amplifier system of claim 1 wherein the bias circuit includes current mirror circuitry.

8. A method for biasing a power amplifier, the method comprising:
   providing a radio-frequency input signal to a power amplifier module, the radio-frequency input signal having a radio-frequency component and a DC bias component;
   decoupling the DC bias component of the radio-frequency input signal from the radio-frequency component;
   providing the decoupled DC bias component to a bias circuit coupled to a base of an amplifying transistor of the power amplifier module;
   providing the decoupled radio-frequency component to the base of the amplifying transistor; and
   generating a radio-frequency output signal using the amplifying transistor.

9. The method of claim 8 wherein said decoupling the DC bias component from the radio-frequency component is performed using a bias tee including an inductor and a resistor.

10. The method of claim 8 further comprising providing a supply voltage to the amplifying transistor.

11. The method of claim 8 wherein the DC bias component of the radio-frequency input signal includes a bias current.

12. The method of claim 8 wherein the DC bias component of the radio-frequency input signal includes a bias voltage.

13. The method of claim 8 wherein the bias circuit includes current mirror circuitry.

14. A radio-frequency module comprising:
   a packaging substrate configured to receive a plurality of components;
   a power amplifier die mounted on the packaging substrate, the power amplifier die including a first semiconductor substrate having formed thereon an amplifying transistor having a base, a collector, and an emitter;
   a radio-frequency input to the power amplifier die configured to receive a radio-frequency input signal having a radio-frequency component and a DC bias component;
   a bias circuit implemented on the first semiconductor substrate, the bias circuit coupled to the base of the amplifying transistor;
   a first bias tee circuit implemented on the first semiconductor substrate, the first bias tee circuit configured to receive the radio-frequency input signal and at least partially pass the DC bias component to the bias circuit and the radio-frequency component to the base of the amplifying transistor; and
   a plurality of connectors configured to provide electrical connections between the power amplifier die and the packaging substrate.

15. The radio-frequency module of claim 14 further comprising:

a controller die mounted on the packaging substrate, the controller die including a second semiconductor substrate and a bias signal generator configured to transmit a bias signal on a bias channel of the radio-frequency module; and a radio-frequency transmission channel configured to transmit a radio-frequency signal within the radio-frequency module.

16. The RF module of claim 15 further comprising:

a second bias tee circuit coupled to the bias channel and the radio-frequency transmission channel, the second bias tee circuit configured to couple the bias signal with the radio-frequency signal to form the radio-frequency input signal at least in part.

17. The radio-frequency module of claim 15 wherein the bias signal generator is a current generator.

18. The radio-frequency module of claim 15 wherein the bias signal generator is a voltage generator.

19. The radio-frequency module of claim 15 wherein the controller die includes an input switching module implemented on the second semiconductor substrate.

20. The radio-frequency module of claim 15 wherein the first semiconductor substrate is a GaAs substrate and the second semiconductor substrate is a silicon-on-insulator die.

* * * * *